(12) United States Patent
Su et al.

(10) Patent No.: US 8,410,535 B2
(45) Date of Patent: Apr. 2, 2013

(54) CAPACITOR AND MANUFACTURING METHOD THEREOF

(75) Inventors: Kuo-Hui Su, Taipei (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 51 days.

(21) Appl. No.: 13/093,840

(22) Filed: Apr. 25, 2011

(65) Prior Publication Data

US 2012/0267760 A1    Oct. 25, 2012

(51) Int. Cl.
*H01L 27/108* (2006.01)
*H01L 29/76* (2006.01)
*H01L 21/8242* (2006.01)

(52) U.S. Cl. ........ 257/306; 257/310; 438/240; 438/243; 438/253

(58) Field of Classification Search .................. 257/306, 257/310, E21.294, E29.255; 438/240, 243, 438/253
See application file for complete search history.

(56) References Cited

U.S. PATENT DOCUMENTS

| | | | |
|---|---|---|---|
| 6,265,260 B1 * | 7/2001 | Alers et al. ..................... | 438/240 |
| 6,437,391 B1 * | 8/2002 | Oh ................................. | 257/306 |
| 7,018,933 B2 | 3/2006 | Kim et al. | |

\* cited by examiner

*Primary Examiner* — Theresa T Doan
(74) *Attorney, Agent, or Firm* — Jianq Chyun IP Office

(57) ABSTRACT

A capacitor and a manufacturing method thereof are provided. The capacitor includes a first electrode, a first metal layer, a dielectric layer and a second electrode. The first electrode is disposed on a substrate. The first metal layer is disposed on the first electrode. The dielectric layer is disposed on the first metal layer, wherein the material of the first metal layer does not react with the material of the dielectric layer. The second electrode is disposed on the dielectric layer.

12 Claims, 3 Drawing Sheets

CAPACITOR AND MANUFACTURING METHOD THEREOF

BACKGROUND OF THE INVENTION

1. Field of Invention

The present invention relates to a capacitor and a manufacturing method thereof, and more generally to a capacitor having a metal layer between an electrode and a dielectric layer and a manufacturing method thereof.

2. Description of Related Art

Generally speaking, capacitors are divided into three categories, i.e., metal-insulator-metal (MIM) capacitors, metal-line to metal-line (MOM) capacitors and metal-insulator-silicon (MIS) capacitors. The MIM capacitors are widely adopted among these capacitors.

In the process of forming a MIM capacitor, a bottom electrode is usually formed on a substrate, and a dielectric layer and a top electrode are sequentially formed on the bottom electrode. The step of forming the dielectric layer includes depositing a high-k dielectric material on the bottom electrode. However, the dielectric material may react with the bottom electrode material due to the high process temperature of the deposition, so that the dielectric constant of the formed dielectric layer is decreased, and the capacitance of the capacitor is accordingly reduced. In addition, since the dielectric material reacts with the bottom electrode material, a leakage current is generated during the operation of the formed capacitor.

Besides, after the capacitor is completed, the dielectric material in the capacitor may react with the bottom electrode material in the following backend high-temp processes, so that the performance of the device is affected.

SUMMARY OF THE INVENTION

The present invention provides a capacitor having a higher capacitance and a lower leakage current.

The present invention further provides a manufacturing method of a capacitor to prevent a dielectric material from reacting with an electrode material.

The present invention provides a capacitor including a first electrode, a first metal layer, a dielectric layer and a second electrode. The first electrode is disposed on a substrate. The first metal layer is disposed on the first electrode. The dielectric layer is disposed on the first metal layer, wherein the material of the first metal layer does not react with the material of the dielectric layer. The second electrode is disposed on the dielectric layer.

According to an embodiment of the present invention, the material of the first metal layer is tungsten nitride, for example.

According to an embodiment of the present invention, the thickness of the first metal layer is from 50 to 150 angstrom, for example.

According to an embodiment of the present invention, the capacitor further includes a second metal layer disposed between the dielectric layer and the second electrode, wherein the material of the second metal layer does not react with the material of the dielectric layer.

According to an embodiment of the present invention, the material of the second metal layer is tungsten nitride, for example.

According to an embodiment of the present invention, the thickness of the second metal layer is from 50 to 150 angstrom, for example.

The present invention further provides a manufacturing method of a capacitor. A first electrode is formed on a substrate. Thereafter, a first metal layer is formed on the first electrode. Afterwards, a dielectric layer is formed on the first metal layer, wherein the material of the first metal layer does not react with the material of the dielectric layer. Further, a second electrode is formed on the dielectric layer.

According to an embodiment of the present invention, the material of the first metal layer is tungsten nitride, for example.

According to an embodiment of the present invention, the thickness of the first metal layer is from 50 to 150 angstrom, for example.

According to an embodiment of the present invention, after the step of forming the dielectric layer and before the step of forming the second electrode, the manufacturing method further includes forming a second metal layer on the dielectric layer, wherein the material of the second metal layer does not react with the material of the dielectric layer.

According to an embodiment of the present invention, the material of the second metal layer is tungsten nitride, for example.

According to an embodiment of the present invention, the thickness of the second metal layer is from 50 to 150 angstrom, for example.

In view of the above, in the present invention, a metal layer is disposed between an electrode and a dielectric layer, and the material of the metal layer does not react with the material of the dielectric layer, so that dielectric constant decrease of the dielectric layer is avoided, and a lower leakage current is generated during the operation of the capacitor.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
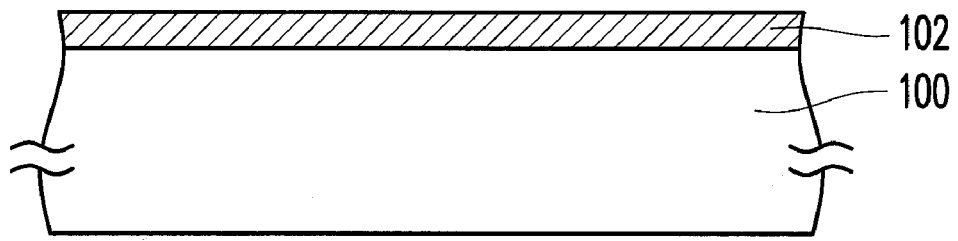
FIGS. 1A to 1C schematically illustrate cross-sectional views of a manufacturing flow of a capacitor according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
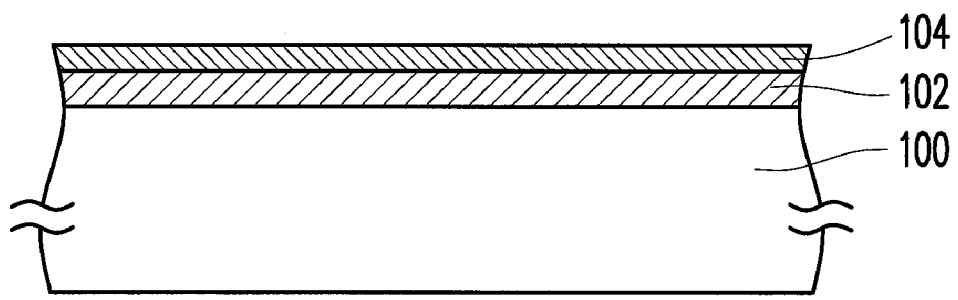
Figure 1C:
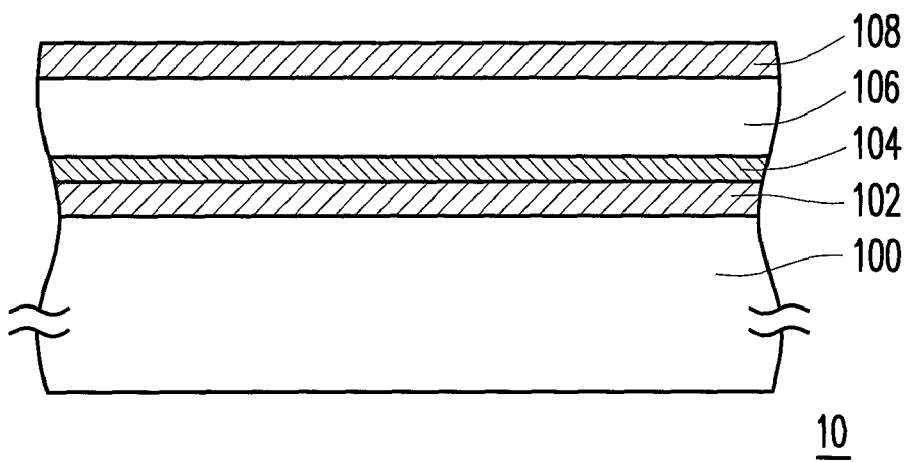

FIGS. 1A to 1C schematically illustrate cross-sectional views of a manufacturing flow of a capacitor according to an embodiment of the present invention. Referring to FIG. 1A, a first electrode 102 is formed on a substrate 100. The substrate 100 is a silicon substrate, for example. The material of the first electrode 102 is titanium, titanium nitride, tantalum, tantalum nitride or a suitable material, for example. The method of forming the first electrode 102 includes performing a chemical vapour deposition (CVD) process.

Referring to FIG. 1B, a first metal layer 104 is formed on the first electrode 102. It is noted that the material of the first metal layer 104 is required not to react with the dielectric material subsequently formed thereon. Further, the first metal layer 104 usually includes a refractory conductor, so as to avoid device performance degradation during the following high-temp processes. The material of the first metal layer 104 is tungsten nitride, for example. The thickness of the first metal layer 104 is from 50 to 150 angstrom, for example. The method of forming the first metal layer 104 includes performing a CVD process.

Referring to FIG. 1C, a dielectric layer 106 is formed on the first metal layer 104. The dielectric layer 106 includes a high-k dielectric material, such as $Al_2O_3$ or a suitable material. The method of forming the dielectric layer 106 includes performing a CVD process. Since the material of first metal layer 104 does not react with the material of the dielectric layer 106, a capacitance reduction caused by dielectric constant decrease of the dielectric layer 106 during the step of forming the dielectric layer 106 can be avoided. In addition, during the step of forming the dielectric layer 106, no reaction occurs at the interface between the first metal layer 104 and the dielectric layer 106, so that a lower leakage current is generated at the interface when the formed capacitor is operated.

Referring to FIG. 1C again, after the step pf forming the dielectric layer 106, a second electrode 108 is formed on the dielectric layer 106, and the manufacturing process of a capacitor 10 is thus completed. The material of the second electrode 108 is titanium, titanium nitride, tantalum, tantalum nitride or a suitable material, for example. The method of forming the second electrode 108 includes performing a CVD process.

It is noted that the material of first metal layer 104 does not react with the material of the dielectric layer 106, so that dielectric constant decrease of the dielectric layer 106 is avoided and a less leakage current is generated during the step of forming the second electrode 108 or during the following high-temp processes.

Further, in another embodiment, after the step of forming the dielectric layer 106 and before the step of forming the second electrode 108, a metal layer which is the same with the first metal layer 104 can be formed on the dielectric layer 106.

Figure 2:
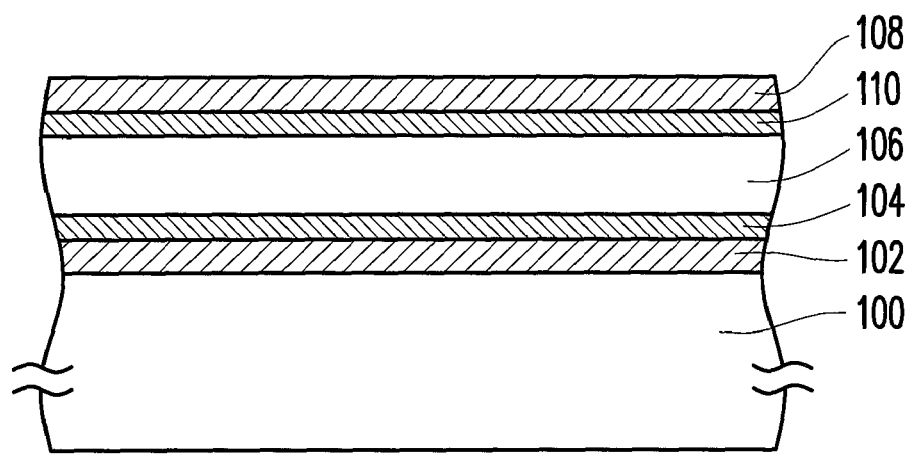
FIG. 2 schematically illustrates a cross-sectional view of a capacitor according to another embodiment of the present invention.

FIG. 2 schematically illustrates a cross-sectional view of a capacitor according to another embodiment of the present invention. Referring to FIG. 2, after the step of forming the dielectric layer 106 and before the step of forming the second electrode 108, a second metal layer 110 is formed on the dielectric layer 106, wherein the material of the second metal layer 110 does not react with the material of the dielectric layer 106. The material of the second metal layer 110 is tungsten nitride, for example. The thickness of the second metal layer 110 is from 50 to 150 angstrom, for example. The method of forming the second metal layer 110 includes performing a CVD process.

Since the material of the second metal layer 110 does not react with the material of the dielectric layer 106, dielectric constant decrease of the dielectric layer 106 is further avoided, and a lower leakage current is generated during the operation of the formed capacitor.

Hereinafter, the capacitor 10 is taken as an example to illustrate the performance of the capacitor of the present invention.

Figure 3:
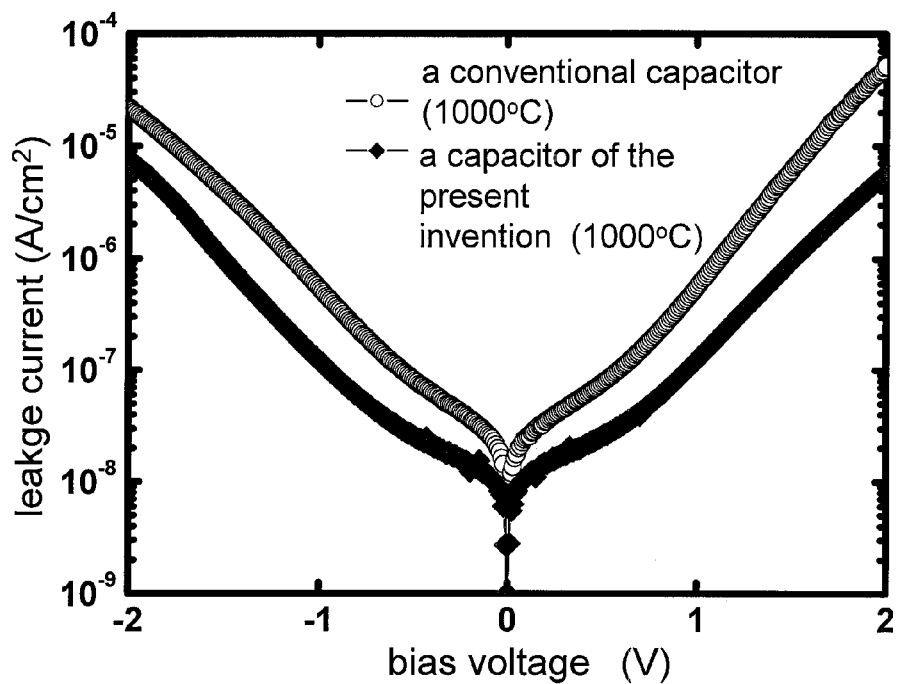
FIG. 3 is a graph showing the correlation between the leakage current and the bias voltage of a capacitor of the present invention and a conventional capacitor.

FIG. 3 is a graph showing the correlation between the leakage current and the bias voltage of the capacitor 10 of the present invention and a conventional capacitor. In the capacitor 10 of the present invention, the first metal layer 104 is disposed between the first electrode 102 (bottom electrode) and the dielectric layer 106, while in the conventional capacitor, a metal layer is not disposed between the bottom electrode and the dielectric layer. As shown in FIG. 3, in the capacitor 10 of the present invention, the dielectric material does not react with the bottom electrode material, so that a lower leakage current is generated when the capacitor 10 of the present invention is operated.

Figure 4:
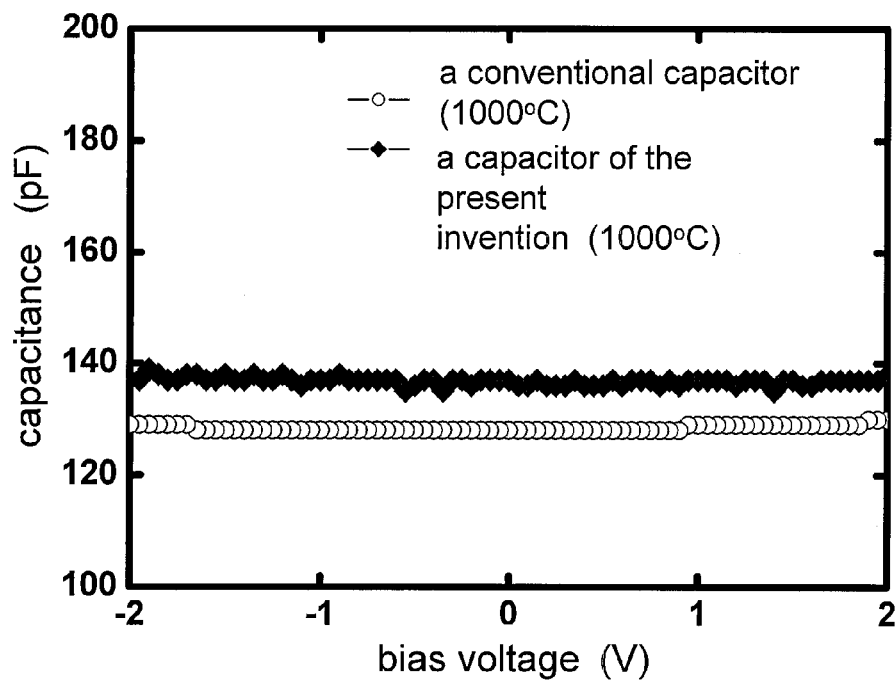
FIG. 4 is a graph showing the correlation between the capacitance and the bias voltage of a capacitor of the present invention and a conventional capacitor.

FIG. 4 is a graph showing the correlation between the capacitance and the bias voltage of the capacitor 10 of the present invention and a conventional capacitor. In the capacitor 10 of the present invention, the first metal layer 104 is disposed between the first electrode 102 (bottom electrode) and the dielectric layer 106, while in the conventional capacitor, a metal layer is not disposed between the bottom electrode and the dielectric layer. As shown in FIG. 4, in the capacitor 10 of the present invention, the dielectric material does not react with the bottom electrode material to decrease the dielectric constant of the dielectric layer 106, so that the capacitor 10 of the present invention can provide a greater capacitance.

It is noted that in the above-mentioned embodiments, a stacked capacitor is provided for illustration purposes and is not construed to limiting the present invention. It is appreciated by persons skilled in the art that in a (deep) trench capacitor, the first metal layer of the present invention can be disposed between a bottom electrode and a dielectric layer, the second metal layer of the present invention can be disposed between a top electrode and the dielectric layer, and the same performance described above can be achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A capacitor, comprising:
   a first electrode, disposed on a substrate, wherein a material of the first electrode comprises titanium nitride or tantalum nitride;
   a first metal layer, disposed on the first electrode;
   a dielectric layer, disposed on the first metal layer, wherein a material of the first metal layer does not react with a material of the dielectric layer, so that dielectric constant decrease of the dielectric layer is avoided and a less leakage current is generated during the step of forming a second electrode or during the following high-temp processes; and
   the second electrode, disposed on the dielectric layer.

2. The capacitor of claim 1, wherein the material of the first metal layer comprises tungsten nitride.

3. The capacitor of claim 1, wherein a thickness of the first metal layer is from 50 to 150 angstrom.

4. The capacitor of claim 1, further comprising a second metal layer disposed between the dielectric layer and the second electrode, wherein a material of the second metal layer does not react with the material of the dielectric layer.

5. The capacitor of claim 4, wherein the material of the second metal layer comprises tungsten nitride.

6. The capacitor of claim 4, wherein a thickness of the second metal layer is from 50 to 150 angstrom.

7. A manufacturing method of a capacitor, comprising:
forming a first electrode on a substrate, wherein a material of the first electrode comprises titanium nitride or tantalum nitride;
forming a first metal layer on the first electrode;
forming a dielectric layer on the first metal layer, wherein a material of the first metal layer does not react with a material of the dielectric layer, so that dielectric constant decrease of the dielectric layer is avoided and a less leakage current is generated during the step of forming a second electrode 108 or during the following high-temp processes; and
forming the second electrode on the dielectric layer.

8. The manufacturing method of claim 7, wherein the material of the first metal layer comprises tungsten nitride.

9. The manufacturing method of claim 7, wherein a thickness of the first metal layer is from 50 to 150 angstrom.

10. The manufacturing method of claim 7, further comprising, after the step of forming the dielectric layer and before the step of forming the second electrode, forming a second metal layer on the dielectric layer, wherein a material of the second metal layer does not react with the material of the dielectric layer.

11. The manufacturing method of claim 10, wherein the material of the second metal layer comprises tungsten nitride.

12. The manufacturing method of claim 10, wherein a thickness of the second metal layer is from 50 to 150 angstrom.

* * * * *